United States Patent
Sun et al.

(10) Patent No.: US 10,204,933 B2
(45) Date of Patent: Feb. 12, 2019

(54) THIN FILM TRANSISTOR AND METHOD FOR MANUFACTURING THE SAME, AND DISPLAY PANEL

(71) Applicant: BOE TECHNOLOGY GROUP CO., LTD., Beijing (CN)

(72) Inventors: Hongda Sun, Beijing (CN); Youngsuk Song, Beijing (CN); Jingang Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/324,791

(22) PCT Filed: Apr. 7, 2016

(86) PCT No.: PCT/CN2016/078671
§ 371 (c)(1),
(2) Date: Jan. 9, 2017

(87) PCT Pub. No.: WO2017/041485
PCT Pub. Date: Mar. 16, 2017

(65) Prior Publication Data
US 2017/0207248 A1    Jul. 20, 2017

(30) Foreign Application Priority Data
Sep. 7, 2015 (CN) .......................... 2015 1 0563151

(51) Int. Cl.
*H01L 27/12* (2006.01)
*H01L 29/786* (2006.01)
(Continued)

(52) U.S. Cl.
CPC ...... *H01L 27/1244* (2013.01); *H01L 27/1262* (2013.01); *H01L 27/1288* (2013.01);
(Continued)

(58) Field of Classification Search
CPC ............. H01L 27/1244; H01L 27/1261; H01L 27/1288; H01L 29/45; H01L 29/4908
See application file for complete search history.

(56) References Cited

U.S. PATENT DOCUMENTS

| 5,714,407 A | 2/1998 | Maeno et al. |
| 8,791,459 B2 | 7/2014 | Moon et al. |

(Continued)

FOREIGN PATENT DOCUMENTS

| CN | 1937250 A | 3/2007 |
| CN | 101752424 A | 6/2010 |

(Continued)

OTHER PUBLICATIONS

International search report dated Jul. 12, 2016 for corresponding PCT application PCT/CN2016/078671.

(Continued)

*Primary Examiner* — Joseph Galvin, III
(74) *Attorney, Agent, or Firm* — Nath, Goldberg & Meyer; Joshua B. Goldberg

(57) ABSTRACT

The application provides a thin film transistor, a method for manufacturing the thin film transistor, and a display panel, the thin film transistor includes a metal electrode, and a step of forming the metal electrode includes: forming a first material layer on a substrate; performing a patterning process on the first material layer to form a groove pattern in the first material layer such that the groove pattern matches with a pattern of the metal electrode to be formed; forming the metal electrode in the groove pattern such that a gap is formed between an edge of the metal electrode and an edge of the groove pattern; forming a protection pattern on the substrate formed with the metal electrode such that the protection pattern covers the metal electrode and its edge. In the application, the protection pattern is formed on the (Continued)

resultant metal electrode and can effectively protect conductive metal.

13 Claims, 3 Drawing Sheets

(51) Int. Cl.
    *H01L 29/45*     (2006.01)
    *H01L 29/49*     (2006.01)
    *H01L 29/66*     (2006.01)

(52) U.S. Cl.
    CPC .......... *H01L 29/45* (2013.01); *H01L 29/4908* (2013.01); *H01L 29/66742* (2013.01); *H01L 29/786* (2013.01)

(56) References Cited

U.S. PATENT DOCUMENTS

| | | | | |
|---|---|---|---|---|
| 2006/0209222 A1* | 9/2006 | Yasuda | ............ | G02F 1/136209 349/43 |
| 2009/0236309 A1* | 9/2009 | Millward | ............ | B81C 1/00031 216/39 |
| 2012/0326126 A1* | 12/2012 | Chen | ................ | H01L 29/42384 257/29 |
| 2013/0187164 A1* | 7/2013 | Oshima | ............. | H01L 29/78693 257/59 |
| 2014/0353690 A1* | 12/2014 | Choi | ................... | H01L 27/1259 257/88 |
| 2015/0001543 A1* | 1/2015 | Moon | ................. | H01L 27/1244 257/72 |
| 2015/0048359 A1* | 2/2015 | Fukase | ................. | H01L 29/511 257/43 |
| 2016/0204156 A1* | 7/2016 | Togashi | ............... | H01L 23/481 257/292 |

FOREIGN PATENT DOCUMENTS

| | | |
|---|---|---|
| CN | 102696111 A | 9/2012 |
| CN | 102983157 A | 3/2013 |
| CN | 103293811 A | 9/2013 |
| CN | 103579220 A | 2/2014 |
| CN | 105047568 A | 11/2015 |

OTHER PUBLICATIONS

English translation of the written opinion of the international searching authority.
First Office Action dated Jul. 10, 2017 in corresponding Chinese Patent Application No. 201510563151.2.

* cited by examiner

THIN FILM TRANSISTOR AND METHOD FOR MANUFACTURING THE SAME, AND DISPLAY PANEL

CROSS REFERENCE

This is a National Phase Application filed under 35 U.S.C. 371 as a national stage of PCT/CN2016/078671 filed on Apr. 7, 2016, an application claiming the benefit of Chinese application No. 201510563151.2 filed on Sep. 7, 2015, the content of each of which is hereby incorporated by reference in its entirety.

FIELD OF THE APPLICATION

The present application relates to the field of display technology, and in particular, relates to a thin film transistor, a method for manufacturing the thin film transistor and a display panel including the thin film transistor.

BACKGROUND OF THE APPLICATION

Both a liquid crystal display panel and an organic light-emitting diode display panel include a large number of thin film transistor switches, and electrodes in the thin film transistor are generally made of metal.

In the existing manufacturing method, a metal layer is easily indented at an edge of a pattern in the etching process to form a concave structure, which is potentially dangerous in the subsequent process, and often leads to a short circuit between an upper metal layer and a lower metal layer, resulting in various display adverse phenomena.

SUMMARY OF THE APPLICATION

An object of the present application is to provide a thin film transistor, a method for manufacturing the thin film transistor and a display panel including the thin film transistor, for solving the problem of adverse phenomenon such as a short circuit due to a concave edge of a metal pattern in the prior art.

To solve the above problem, as an aspect of the application, a method for manufacturing a thin film transistor is provided, wherein the thin film transistor includes a metal electrode, and the method includes a step of forming the metal electrode, and the step of forming the metal electrode includes:

forming a first material layer on a substrate;

performing a patterning process on the first material layer to form a groove pattern in the first material layer such that the groove pattern matches with a pattern of the metal electrode to be formed;

forming the metal electrode in the groove pattern such that a gap is formed between an edge of the metal electrode and an edge of the groove pattern; and forming a protection pattern on the substrate formed with the metal electrode such that the protection pattern covers the metal electrode and its edge.

Optionally, the step of forming a protection pattern on the substrate formed with the metal electrode includes:

forming a protection layer on the substrate formed with the metal electrode;

heating the protection layer such that a part of the protection layer in the gap is broken to form a first part covering the metal electrode and its edge and a second part covering the first material layer; and removing the first material layer and the second part of the protection layer on the first material layer to obtain the protection pattern covering the metal electrode and its edge.

Optionally, a material of the first material layer can be dissolved in fluoride-containing solvent, and the step of performing a patterning process on the first material layer includes:

forming a photoresist layer on the first material layer, and performing exposure and development on the photoresist layer to form a mask pattern such that the mask pattern includes an opening which matches with a pattern of the metal electrode to be formed; and washing a part of the first material layer uncovered by the mask pattern with the fluoride-containing solvent to form the groove pattern.

Optionally, the step of forming the metal electrode in the groove pattern includes:

depositing a metal layer such that one part of the metal layer is located within the groove pattern, and the other part of the metal layer is located on the mask pattern; and peeling off the mask pattern and metal thereon.

Optionally, a material of the first material layer can be dissolved in fluoride-containing solvent, and the step of removing the first material layer and the second part of the protection layer on the first material layer includes:

washing the first material layer with the fluoride-containing solvent to remove the first material layer and the second part of the protection layer on the first material layer.

Optionally, the fluoride-containing solvent includes fluoride based solvent containing N2 group.

Optionally, a material for forming the protection pattern includes any one of molybdenum, niobium and titanium, or alloy thereof.

Optionally, metal for forming the metal electrode includes copper or copper alloy.

Optionally, the metal electrode is a gate electrode.

Optionally, the metal electrode includes a source electrode and a drain electrode.

As a second aspect of the application, a thin film transistor is further provided, the thin film transistor includes a metal electrode, a protection pattern is provided on the metal electrode, and the protection pattern covers the metal electrode and its edge.

Optionally, a material for forming the protection layer includes any one of molybdenum, niobium and titanium, or alloy thereof.

Optionally, metal for forming the metal electrode includes copper or copper alloy.

As a third aspect of the application, a display panel is further provided and the display panel includes the above thin film transistor of the application.

In the application, through forming the groove pattern in the first material layer, depositing the metal electrode in the groove pattern, and depositing the protection layer material by using the gap between the edge of the groove pattern and the edge of the metal electrode, the resultant protection pattern covering the metal electrode and its edge functions as protecting the conductive metal effectively. Compared to the method in the prior art that the metal layer is etched to form the metal electrode, the edge of the metal electrode in the application protrudes and attaches to the substrate, and the concave edge will not occur, and when this metal electrode is applied to the display panel, various display adverse phenomena can be decreased.

BRIEF DESCRIPTION OF THE DRAWINGS

The accompanying drawings are provided for further understanding of the present application and constitute a part of the description. The accompanying drawings, together with the following embodiments, are provided for explaining the present invention rather than limiting the present invention. In the drawings.

DESCRIPTION OF REFERENCE NUMERALS

1—substrate; 2—first material layer; 21—groove pattern; 3—photoresist layer; 31—mask pattern; 4—metal electrode; 5—protection layer; and 51—protection pattern.

DETAILED DESCRIPTION OF THE EMBODIMENTS

Embodiments of the present application will be described in detail below with reference to the accompanying drawings. It should be understood that, the embodiments described herein are for the purpose of describing and explaining the present invention, rather than limiting the scope of the present invention.

Figure 1:
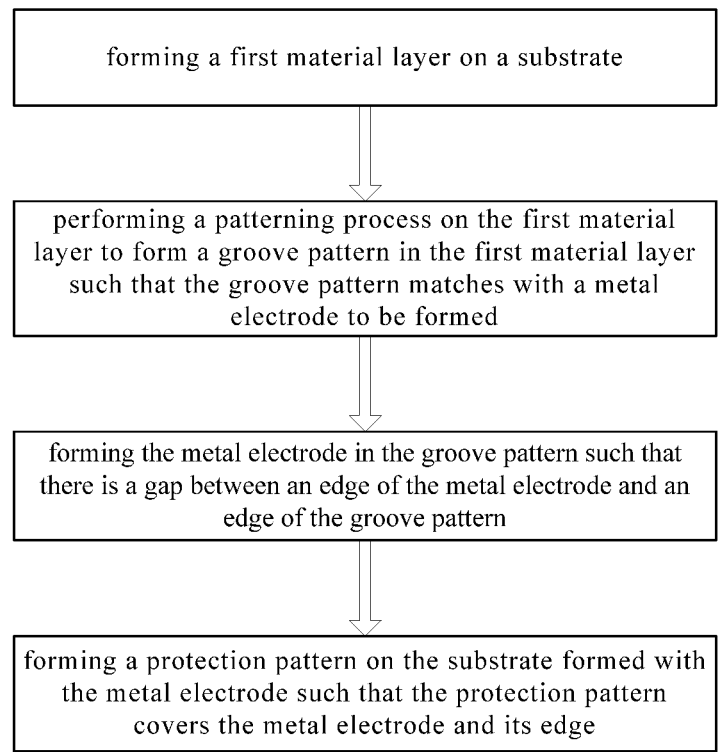
FIG. 1 is a flow chart illustrating a method for manufacturing a thin film transistor according to an embodiment of the application.

The application first provides a method for manufacturing a thin film transistor, wherein the thin film transistor includes a metal electrode, the method includes a step of forming the metal electrode, and as shown in FIG. 1, the step of forming the metal electrode includes steps:

forming a first material layer on a substrate;

performing a pattering process on the first material layer to form a groove pattern in the first material layer such that the groove pattern matches with a pattern of the metal electrode to be formed;

forming the metal electrode in the groove pattern such that a gap is formed between an edge of the metal electrode and an edge of the groove pattern; and forming a protection pattern on the substrate formed with the metal electrode such that the protection pattern covers the metal electrode and its edge.

In the application, through forming the groove pattern in the first material layer, depositing the metal electrode in the groove pattern, and depositing the protection layer material by using the gap between the edge of the groove pattern and the edge of the metal electrode, the resultant protection pattern covering the metal electrode and its edge functions as protecting the conductive metal effectively. Compared to the method in the prior art that the metal layer is etched to form the metal electrode, the edge of the metal electrode in the application protrudes and attaches to the substrate, and the concave edge will not occur, and when the metal electrode is applied to the display panel, various display adverse phenomena can be decreased.

In the application, the first material layer may be formed by a coating process, and the metal electrode and the protection pattern may be formed by a deposition process.

The step of forming the protection pattern may include:

forming a protection layer on the substrate formed with the metal electrode;

heating the protection layer such that a part of the protection layer in the gap is broken to form a first part covering the metal electrode and its edge and a second part covering the first material layer; and removing the first material layer and the second part of the protection layer on the first material layer to obtain the protection pattern covering the metal electrode and its edge.

Optionally, a material for forming the protection pattern includes any one of molybdenum, niobium and titanium, or alloy thereof. The protection layer functions as a surface oxidation-resistant layer. When the protection layer is heated, the substrate formed with the protection layer is placed into an oven, and a temperature of the oven may be set to be a forging temperature of the corresponding metal such that the protection layer may be broken at the gap.

Optionally, a material of the first material layer can be dissolved in fluoride-containing solvent, and the step of performing a pattering process on the first material layer includes:

forming a photoresist layer on the first material layer, and performing exposure and development on the photoresist layer to form a mask pattern such that the mask pattern includes an opening which matches with a pattern of the metal electrode to be formed; and washing a part of the first material layer uncovered by the mask pattern with the fluoride-containing solvent to form the groove pattern.

The fluoride-containing solvent may include fluoride based solvent containing N2 group. It should be pointed out that, since the first material layer is in contact with the photoresist layer, the material of the first material layer should further have anti-peeling characteristics. That is, the first material layer may be remained when the remaining photoresist is removed.

Further, the step of forming the metal electrode in the groove pattern includes:

depositing a metal layer such that one part of the metal layer is located within the groove pattern, and the other part of the metal layer is located on the mask pattern; and peeling off the mask pattern and metal thereon.

The step of peeling off the mask pattern may employ a process for washing photoresist, and as described above, the material for forming the first material layer should not be dissolved in the solvent for washing photoresist.

Further, the step of removing the first material layer and the second part of the protection layer on the first material layer includes:

washing the first material layer with the fluoride-containing solvent to remove the first material layer and the second part of the protection layer on the first material layer.

Since the first material layer can be dissolved in fluoride-containing solvent, using the fluoride-containing solvent to wash the first material layer can remove the remaining first material layer and the protection layer thereon, to finally obtain the metal electrode and the protection pattern covering the metal electrode and its edge.

In the application, metal for forming the metal electrode is preferably copper or copper alloy. Copper or copper alloy have various advantages of high temperature resistance, small thermal expansion coefficient, good electrical conductivity, simple manufacture process and the like, and is very suitable for forming the metal electrode in the application.

In addition, the metal electrode in the application may be a gate electrode, or may be a source electrode or a drain electrode.

The method for manufacturing a thin film transistor according to the application will be described in detail below in conjunction with FIGS. 2a to 2h.

Figure 2A:
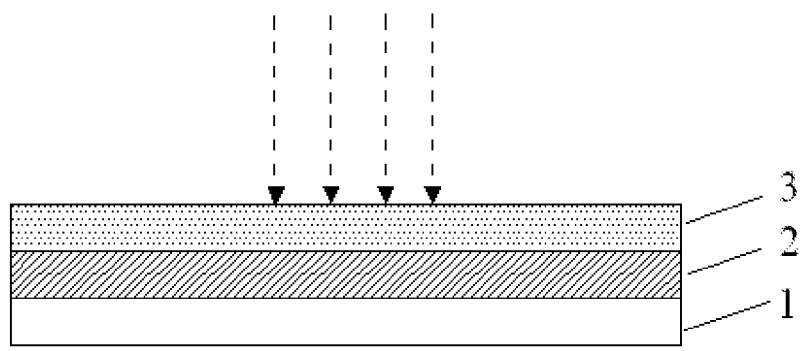
FIGS. 2a to 2h are schematic views illustrating various steps for manufacturing the thin film transistor according to the embodiment of the application.

First, a first material layer 2, which can be dissolved in fluoride-containing solvent, is coated on a substrate 1, and a photoresist layer 3 is applied on the first material layer 2, as shown in FIG. 2a.

Figure 2B:
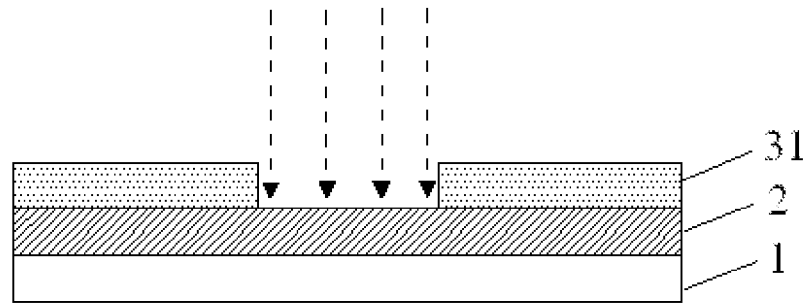

After then, exposure and development are performed on the photoresist layer 3, to obtain a mask pattern 31, and the mask patter 31 includes an opening which matches with a pattern of a metal electrode to be formed, as shown in FIG. 2b.

Figure 2C:
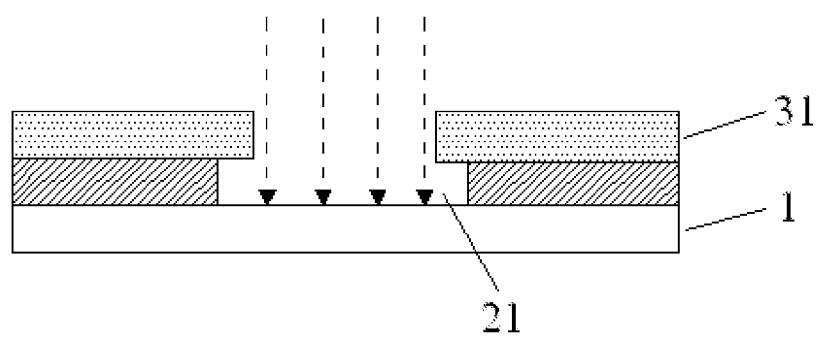

After then, a part of the first material layer 2 uncovered by the mask pattern 31 is washed away with fluoride-containing solvent, and a groove pattern 21 is formed in the first material layer 2, as shown in FIG. 2c. This step is equivalent to a wet etching process, and an edge of the groove pattern 21 is remarkably indented compared to an edge of the mask pattern 31.

Figure 2D:
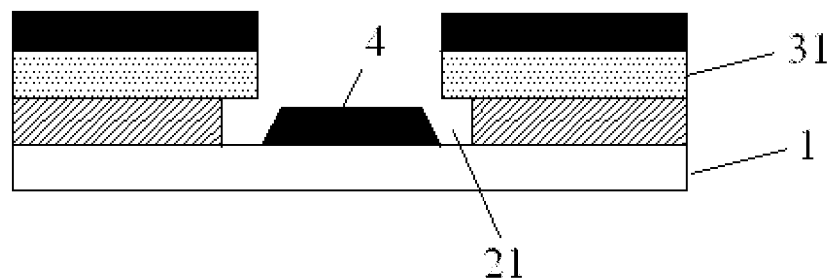

After then, a metal layer is deposited, and due to block of the mask pattern 31, one part of the metal layer falls into the groove pattern 21 to be in contact with the substrate 1 and form a metal electrode 4, and the other part of the metal layer is located on the mask pattern 31, as shown in FIG. 2d. Moreover, a gap is formed between an edge of the metal electrode 4 and an edge of the groove pattern 21.

Figure 2E:
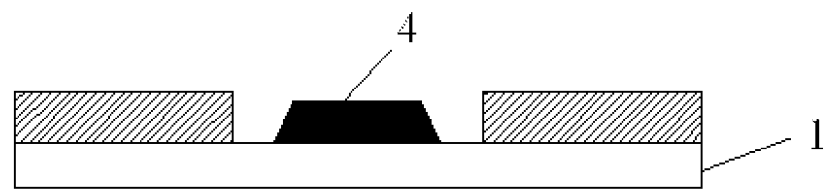

After then, the mask pattern 31 and metal thereon are removed by a peeling process, as shown in FIG. 2e.

Figure 2F:
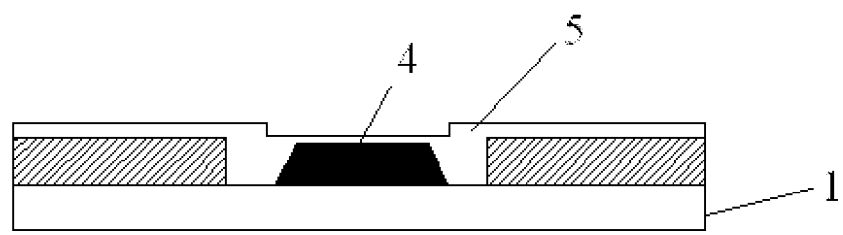
Figure 2G:
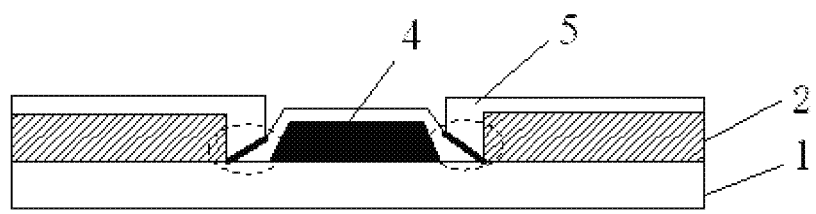

After then, a protection layer 5 is deposited on the substrate subjected to the previous steps, as shown in FIG. 2f, and the protection layer 5 is heated, and since difference between thermal expansion coefficients of different materials is relatively large, a part of the protection layer 5 in the gap is broken (as shown in the circle of FIG. 2g), so as to form a first part covering the metal electrode 4 and its edge, and a second part covering the first material layer 2.

Figure 2H:
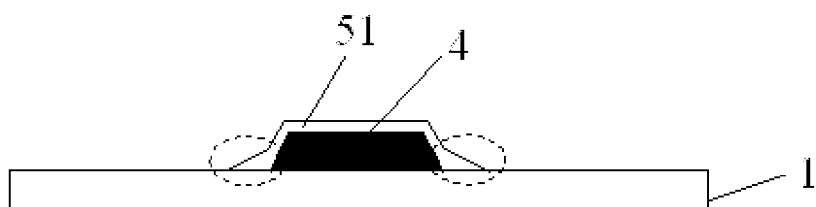

Finally, the first material layer 2 and the second part of the protection layer 5 thereon are removed by using fluoride-containing solvent, to form the metal electrode 4 together with the protection pattern 51 thereon, and the protection pattern 51 covers the metal electrode 4 and its edge (as shown in the circle of FIG. 2h).

In the application, through forming the groove pattern 21 in the first material layer 2, depositing the metal electrode 4 in the groove pattern 21, and depositing the protection layer material by using the gap between the edge of the groove pattern 21 and the edge of the metal electrode 4, the resultant protection pattern 51 covering the metal electrode 4 and its edge functions as protecting the conductive metal effectively. Compared to the method in the prior art that the metal layer is etched to form the metal electrode, the edge of the metal electrode 4 in the application protrudes and attaches to the substrate 1, and the concave edge will not occur, and when this metal electrode is applied to the display panel, various display adverse phenomena can be decreased.

The application further provides a thin film transistor, including a metal electrode, as shown in FIG. 2h, the protection pattern 51 is provided on the metal electrode 4, and the protection pattern 51 covers the metal electrode 4 and its edge.

In the application, the protection pattern 51 covers the metal electrode 4 and its edge, and functions as protecting conductive metal effectively. Moreover, based on the above method of the application, the edge of the metal electrode 4 of the application protrudes and attaches to the substrate 1, and the concave edge will not occur, which can reduce adverse phenomena such as a short circuit.

Optionally, a material for forming the protection pattern 51 includes any one of molybdenum, niobium and titanium, or alloy thereof. The protection pattern 51 functions as an oxidation-resistant layer for the surface of the metal electrode 4.

Optionally, metal for forming the metal electrode includes copper or copper alloy. Copper or copper alloy have various advantages of high temperature resistance, small thermal expansion coefficient, good electrical conductivity, simple manufacture process and the like, and is very suitable for forming the metal electrode in the application.

Further, the application provides a display panel, which includes the above thin film transistor provided by the application. As described above, the display panel provided by the application can effectively avoid the adverse phenomena such as short circuit from occurring, and thus can improve product yield since it has the protection pattern covering the edge of the metal electrode.

It should be understood that, the above embodiments are only exemplary embodiments for the purpose of explaining the principle of the present application, but the present application is not limited thereto. For a person having ordinary skill in the art, various improvements and modifications may be made without departing from the spirit and essence of the present application. These improvements and modifications also fall within the protection scope of the present application.

What is claimed is:

1. A method for manufacturing a thin film transistor, wherein the thin film transistor includes a metal electrode, the method includes a step of forming the metal electrode, and the step of forming the metal electrode includes:
    forming a first material layer on a substrate;
    performing a patterning process on the first material layer to form a groove pattern in the first material layer such that the groove pattern matches with a pattern of the metal electrode to be formed;
    forming the metal electrode in the groove pattern such that the metal electrode is up-narrow and down-wide, and an up-wide and down-narrow gap is formed between an edge of the metal electrode and an edge of the groove pattern;
    forming a protection layer on the patterned first material layer and the metal electrode, and in the up-wide and down-narrow gap; and
    forming a protection pattern from the protection layer such that the protection pattern covers the metal electrode and its edge;
    wherein the step of forming a protection pattern on the substrate formed with the metal electrode includes:
    heating the protection layer such that a part of the protection layer in the up-wide and down-narrow gap is broken to form a first part covering the metal electrode and its edge and a second part covering the first material layer; and
    removing the first material layer and the second part of the protection layer on the first material layer to obtain the protection pattern covering the metal electrode and its edge.

2. The method of claim 1, wherein a material of the first material layer can be dissolved in fluoride-containing solvent, and the step of performing a patterning process on the first material layer includes:
    forming a photoresist layer on the first material layer, and performing exposure and development on the photoresist layer to form a mask pattern such that the mask pattern includes an opening which matches with a pattern of the metal electrode to be formed; and washing a part of the first material layer uncovered by the mask pattern with the fluoride-containing solvent to form the groove pattern.

3. The method of claim 2, wherein the step of forming the metal electrode in the groove pattern includes:

depositing a metal layer such that one part of the metal layer is located within the groove pattern, and the other part of the metal layer is located on the mask pattern; and peeling off the mask pattern and metal thereon.

4. The method of claim 1, wherein a material of the first material layer can be dissolved in fluoride-containing solvent, and the step of removing the first material layer and the second part of the protection layer on the first material layer includes:

washing the first material layer with the fluoride-containing solvent to remove the first material layer and the second part of the protection layer on the first material layer.

5. The method of claim 2, wherein the fluoride-containing solvent includes fluoride based solvent containing N2 group.

6. The method of claim 1, wherein a material for forming the protection pattern includes any one of molybdenum, niobium and titanium, or alloy thereof.

7. The method of claim 1, wherein metal for forming the metal electrode includes copper or copper alloy.

8. The method of claim 1, wherein the metal electrode is a gate electrode.

9. The method of claim 1, wherein the metal electrode includes a source electrode and a drain electrode.

10. The method of claim 3, wherein the fluoride-containing solvent includes fluoride based solvent containing N2 group.

11. The method of claim 4, wherein the fluoride-containing solvent includes fluoride based solvent containing N2 group.

12. The method of claim 2, wherein a material for forming the protection pattern includes any one of molybdenum, niobium and titanium, or alloy thereof.

13. The method of claim 2, wherein metal for forming the metal electrode includes copper or copper alloy.

* * * * *